(12) United States Patent
Song et al.

(10) Patent No.: US 7,224,245 B2
(45) Date of Patent: May 29, 2007

(54) DUPLEXER FABRICATED WITH MONOLITHIC FBAR AND ISOLATION PART AND A METHOD THEREOF

(75) Inventors: In-sang Song, Seoul (KR); Byeoung-ju Ha, Yongin-si (KR); Yun-kwon Park, Dongducheon-si (KR); Kuang-woo Nam, Seoul (KR); Dong-ha Shim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 107 days.

(21) Appl. No.: 10/989,403

(22) Filed: Nov. 17, 2004

(65) Prior Publication Data
US 2005/0134401 A1 Jun. 23, 2005

(30) Foreign Application Priority Data
Dec. 22, 2003 (KR) ............... 10-2003-0094375

(51) Int. Cl.
*H03H 9/70* (2006.01)
*H03H 3/02* (2006.01)
(52) U.S. Cl. ............... 333/133; 333/189; 29/25.35
(58) Field of Classification Search ............... 333/133
See application file for complete search history.

(56) References Cited

U.S. PATENT DOCUMENTS

| | | | |
|---|---|---|---|
| 5,166,646 A | 11/1992 | Avanic et al. | |
| 5,864,260 A | 1/1999 | Lee | |
| 6,081,171 A * | 6/2000 | Ella | 333/189 |
| 6,407,649 B1 * | 6/2002 | Tikka et al. | 333/133 |
| 6,608,533 B2 * | 8/2003 | Kushitani et al. | 333/126 |
| 6,710,681 B2 * | 3/2004 | Figueredo et al. | 333/187 |
| 6,885,260 B2 * | 4/2005 | Nishimura et al. | 333/133 |
| 6,911,708 B2 * | 6/2005 | Park | 257/416 |
| 6,927,649 B2 * | 8/2005 | Metzger et al. | 333/133 |
| 2002/0021192 A1 * | 2/2002 | Klee et al. | 333/187 |
| 2004/0130410 A1 | 7/2004 | Nishimura et al. | |
| 2004/0257171 A1 * | 12/2004 | Park et al. | 333/133 |
| 2005/0253668 A1 * | 11/2005 | Song et al. | 333/133 |

FOREIGN PATENT DOCUMENTS

WO  WO 02/093763 A1  11/2001
WO  WO 2004/075402 A1  9/2004

OTHER PUBLICATIONS

Park Jae Y.: "Micormachined Fbar RF Filters for Advanced Handset Applications", Database WPI, Derwent Publications Ltd., London, GB, Jun. 9, 2003, pp. 911-914.

* cited by examiner

*Primary Examiner*—Barbara Summons
(74) *Attorney, Agent, or Firm*—Sughrue Mion, PLLC

(57) ABSTRACT

A duplexer having a filter and an isolation part which are integrally formed including a substrate, a transmitter filter integrated on the substrate to pass signals only in a frequency band for transmission, a receiver filter integrated on the substrate to pass signals only in a frequency band for reception, and an isolation part integrally formed with either one of the transmitter filter and the receiver filter to isolate the signals passed through the transmitter filter and the receiver filter from each other. Since the isolation part is integrally formed with either one of the transmitter filter and the receiver filter, the duplexer can be manufactured in a small size by simplified processes.

6 Claims, 4 Drawing Sheets ved performance by adding an isolation part which can prevent the inter-signal interference by isolating the transmitter filter and the receiver filter from each other.

DUPLEXER FABRICATED WITH MONOLITHIC FBAR AND ISOLATION PART AND A METHOD THEREOF

CROSS-REFERENCE TO RELATED APPLICATIONS

This application claims priority from Korean Patent Application No. 2003-94375, filed Dec. 22, 2003, in the Korean Intellectual Property Office, the disclosure of which is incorporated herein by reference.

BACKGROUND OF THE INVENTION

1. Field of the Invention

The present invention relates to a duplexer fabricated with a film bulk acoustic resonator (FBAR), and a method for manufacturing the same. More particularly, the present invention relates to a duplexer fabricated with a monolithic FBAR and an isolation part, and a method for manufacturing the same.

2. Description of the Related Art

As the use of mobile communication devices, represented by a mobile phone, has been increasing recently, studies and efforts for higher performance of each component and miniaturization of the devices have increased.

One of the main component parts of the mobile communication devices is a duplexer which utilizes a plurality of filters. The duplexer splits signals for reception and transmission via a single antenna in a frequency division duplex (FDD) type communication system such that one antenna can effectively be shared.

Besides the antenna, the duplexer includes a transmitter filter and a receiver filter. The transmitter filter is a band pass filter which passes only a signal in a frequency band for transmission, and the receiver filter is a band pass filter which passes only a signal in a frequency band for reception. The duplexer can perform the signal transmission and reception on the same antenna by varying the frequencies passing through the transmitter filter and the receiver filter.

For the transmitter and receiver filters, which are the basic components of the duplexer, a film bulk acoustic resonator (FBAR) can be employed since it can be mass-produced at minimum cost and can be implemented in minimum size. In addition, the FBAR enables a high quality factor (Q) which is a special feature of the filter, and can be used in a micro frequency band. Especially, the FBAR is able to realize even a personal communication system (PCS) band and a digital cordless system (DCS) band.

The FBAR element generally comprises a lower electrode, a piezoelectric layer, and an upper electrode deposited in order, and resonates as an external electric field is applied. In other words, when an electric field that changes with time is induced in the piezoelectric layer from on electric energy applied to the upper and lower electrodes of the FBAR, the piezoelectric layer causes piezoelectricity where the electric energy is converted to an acoustic wave mechanic energy, thereby generating resonance. Since only signals in a predetermined band with respect to the resonance frequency can pass, the FBAR operates as a band pass filter.

For better performance of the duplexer which splits signals received and transmitted via one antenna, intersignal interference should be prevented. Since a difference between the frequencies of the signals transmitted and received through the transmitter filter and the receiver filter is small, the signals are quite sensitive to the inter-signal interference. Accordingly, the duplexer can have an improved performance by adding an isolation part which can prevent the inter-signal interference by isolating the transmitter filter and the receiver filter from each other.

The isolation part implements a phase shifter using a capacitor and an inductor to prevent the inter-signal interference by making the phase difference between the frequencies of the transmitted signal and the received signal substantially at 90°.

The duplexer includes a Bragg reflective-type duplexer and an air gap-type duplexer according to the FBAR. When a resonance part which generates a resonance is separated from a substrate part for better resonance efficiency of the FBAR, the Bragg reflective-type duplexer uses a reflection layer while the air gap-type duplexer uses an air gap for the separation of filters.

A Bragg reflective-type FBAR is formed in a manner that the reflection layer is formed by vapor-depositing materials of high acoustic impedance and low acoustic impedance alternately, and then, a lower electrode, a piezoelectric layer and an upper electrode are deposited on the reflection layer in order. The Bragg reflective-type duplexer is fabricated by integrating the Bragg reflective-type FBAR on a substrate. Therefore, the Bragg reflective-type duplexer can be implemented in a one-chip system and have a stable structure. However, the thickness of each layer is hard to minutely control, and the film easily gets cracked due to a stress caused by forming the thick reflection layer. Furthermore, the quality factor (Q) is considerably inferior compared to the air gap-type duplexer.

FIG. 1 is a plan view showing the structure of a conventional air gap-type duplexer adopting an air gap-type FBAR. Referring to FIG. 1, the air gap-type duplexer comprises an electrode terminal 10, a transmitter filter 20, an isolation part 30 and a receiver filter 40, all of which are integrated on the substrate. As described above, the transmitter filter 20 and the receiver filter 40 comprise the air gap-type FBAR, which is structured by depositing the lower electrode, the piezoelectric layer and the upper electrode in order on the air gap which is formed on the substrate. A plurality of the FBARs may be combined into one filter.

The isolation part 30, being separately fabricated, is integrated on the substrate part between the transmitter and receiver filters 20 and 40 in order to isolate signals passing through the filters 20 and 40. For this, the isolation part 30 operates as a phase shifter which makes the phase difference between the frequencies of the transmitted and received signals substantially at 90° by combining the inductor and the capacitor in a predetermined form, or forming a transmission line of λ/4 in length. Accordingly, a signal flow between the transmitter filter 20 and the receiver filter 40 can be prevented. The transmitter filter 20, the receiver filter 40 and the isolation part 30 are connected to the external electrode terminal through wire bonding.

According to the conventional duplexer, since the filters 20 and 40 and the isolation part 30 are separately fabricated and then integrated on a single substrate, complex manufacturing process was required. Further, the capacitor constituting the isolation part 30 is fabricated using a dielectric layer having a superior permittivity, however, since the manufacture of the dielectric layer includes a high-temperature requiring process, components may be damaged by heat.

SUMMARY OF THE INVENTION

An aspect of the present invention is to solve at least the above problems and/or disadvantages and to provide at least the advantages described below. Accordingly, an aspect of the present invention is to provide a duplexer fabricated with a monolithic FBAR and an isolation part, and a method for manufacturing the same.

In order to achieve the above-described aspects of the present invention, there is provided a duplexer comprising a substrate, a transmitter filter integrated on the substrate to pass signals only in a frequency band for transmission, a receiver filter integrated on the substrate to pass signals only in a frequency band for reception, and an isolation part integrally formed with any one of the transmitter filter and the receiver filter to isolate the signals passed through the transmitter filter and the receiver filter from each other.

The transmitter filter and the receiver filter respectively comprise at least one film bulk acoustic resonator (FBAR) which comprises a cavity part formed on a predetermined area of the substrate, a membrane deposited on the substrate and covering the cavity part, and a stacked resonance part formed on a cavity-covering part of the membrane, by comprising a lower electrode, a piezoelectric layer and an upper electrode stacked in order.

The isolation part comprises at least one capacitor using the membrane as a dielectric layer and having an electrostatic capacitance proportional to a certain permittivity of the membrane, and at least one inductor formed in a coil type on a surface of the membrane, in order to isolate the signals passing through the transmitter and receiver filters by making a frequency phase difference of the signals to be substantially 90°. A phase shifter may be used for the isolation part.

The capacitor may comprise a capacitor lower electrode deposited between the substrate and the membrane, and a capacitor upper electrode deposited on the membrane disposed on the capacitor lower electrode in order to have a capacitance proportional to a certain permittivity of the membrane.

A method for fabricating a duplexer which comprises a transmitter filter for passing signals only in a frequency band for transmission, a receiver filter for passing signals only in a frequency band for reception, and an isolation part for isolating the signals passed through the transmitter filter and the receiver filter from each other, the method comprises the steps of (a) depositing and patterning a first metal layer on a substrate, (b) depositing a membrane on the first metal layer and over the whole substrate, (c) depositing and patterning a second metal layer on the membrane which is directly contacting on the substrate, (d) depositing a piezoelectric layer on a predetermined area of the second metal layer, (e) depositing a third metal layer on the membrane and the piezoelectric layer, and (f) integrally forming the isolation part with one of the transmitter filter and the receiver filter, by patterning the third metal layer.

The method may further comprise the steps of forming a via hole reaching the substrate disposed under the piezoelectric layer, and forming a cavity part by etching a predetermined area of a lower substrate of the piezoelectric layer using the via hole.

At least one of the transmitter filter and the receiver filter comprises at least one FBAR formed by depositing the second metal layer, the piezoelectric layer, and the third metal layer in order on the membrane which covers the cavity part.

The step (f) comprises the steps of forming a capacitor by patterning the third metal layer so that the third metal layer is formed on the membrane deposited on the first metal layer, forming an inductor by patterning the third metal layer so that the third metal layer is formed in a coil type, and forming the FBAR by patterning the third metal layer so that the third metal layer is formed on the piezoelectric layer.

Accordingly, the duplexer can be fabricated by integrating on a single substrate the monolithic FBAR and the isolation part formed as the above, and a separately-manufactured FBAR. In addition, since the membrane layer used for manufacture of the FBAR can be used as a dielectric layer constituting the capacitor in the isolation part, the manufacturing process is simplified.

BRIEF DESCRIPTION OF THE DRAWING FIGURES

The above aspect and other features of the present invention will become more apparent by describing in detail exemplary embodiments thereof with reference to the attached drawing figures, wherein.

DETAILED DESCRIPTION OF THE EXEMPLARY EMBODIMENTS

Figure 1:
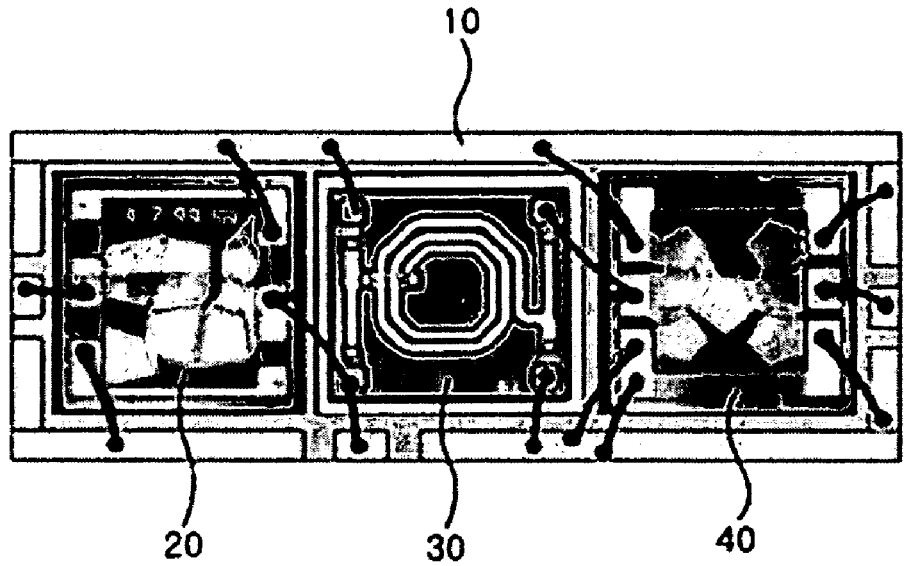
FIG. 1 is a plan view showing a conventional air gap-type duplexer comprising a transmitter filter, a receiver filter and an isolation part as separately manufactured and integrated.

Hereinafter, an exemplary embodiment of the present invention will be described in detail with reference to the accompanying drawing figures.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 2:
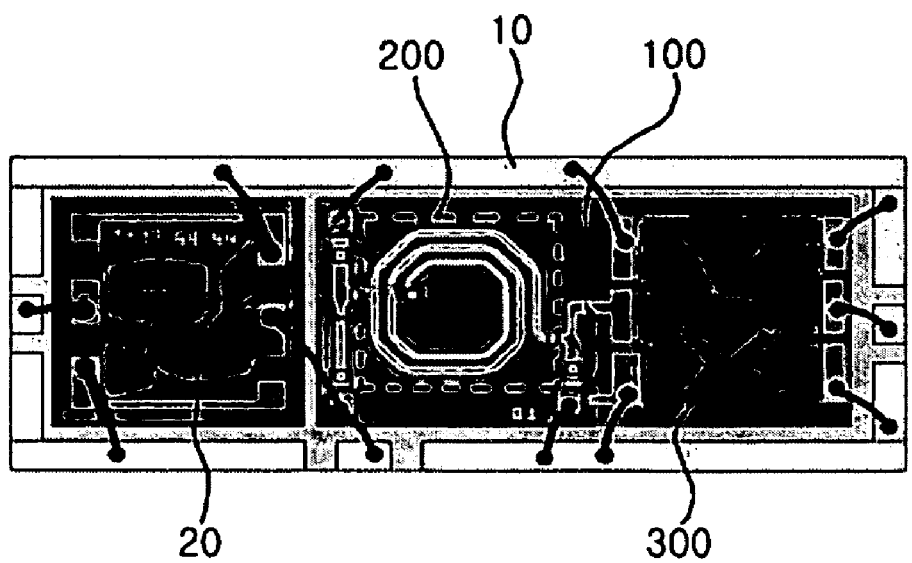
FIG. 2 is a plan view showing an integrated duplexer using a monolithic film bulk acoustic resonator (FBAR) and the isolation part according to an exemplary embodiment of the present invention.

FIG. 2 is a plan view illustrating the structure of a duplexer according to an exemplary embodiment of the present invention. Referring to FIG. 2, besides an electrode terminal 10 and a filter 20, the duplexer further comprises a micro electro mechanical systems (MEMS) structure 100 in which an isolation part 200 and a second filter 300 are integrally formed. As previously explained in the related art, recently, a transmitter filter and a receiver filter are implemented using an air gap-type film bulk acoustic resonator (FBAR). Each of the filters may comprise a single FBAR, or alternatively, a plurality of the FBARs may be connected for better tuning characteristics. The first filter 20 and the second filter 300 operate as any of the transmitter filter and the receiver filter, and the isolation part 200 can be integrally manufactured with one of the filters 20 and 300. FIG. 2 illustrates an example where the isolation part 200 and the second filter 300 are integrally formed.

The isolation part 200 isolates the filter 20 and the second filter 300 from each other using an LC structure which is a certain combination of an inductor and a capacitor. Referring to FIG. 2, in the duplexer according to an embodiment of the present invention, the first filter 20, the isolation part 200 and the second filter 300 are connected to the external electrode terminal 10 through wire bonding.

Figure 3:
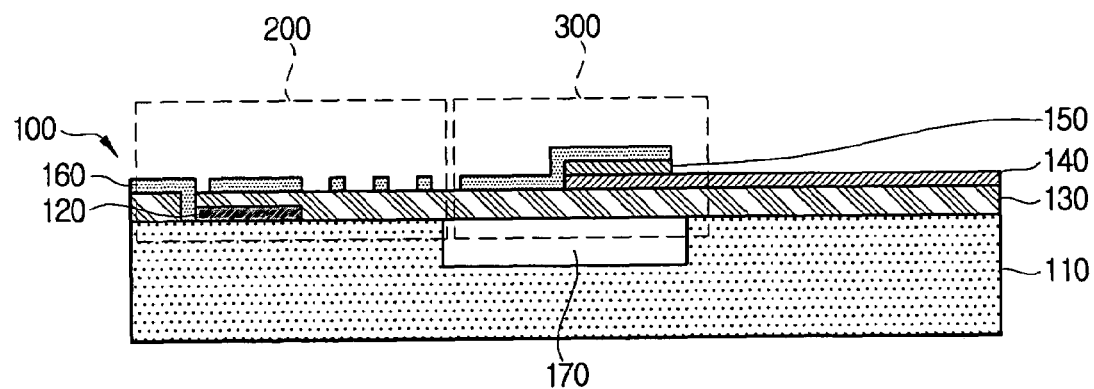
FIG. 3 is a sectional view showing the structure of the monolithic FBAR and the isolation part according to an exemplary embodiment of the present invention.

FIG. 3 is a sectional view showing the MEMS structure 100 integrated by the isolation part 200 and the second filter 300 according to an embodiment of the present invention. Although FIG. 3 illustrates an example where a single air gap-type FBAR is used as the second filter 300, a plurality of FBARs may be used for the second filter 300. Referring to FIG. 3, a cavity part 170 is formed on a predetermined area of a substrate 110, and a membrane 130 is deposited on the whole top surface of the substrate 110 to cover the cavity part 170. The cavity part 170 forms the air gap which separates a resonating part in the air gap-type FBAR from the substrate part.

A lower electrode 140, a piezoelectric layer 150, and an upper electrode 160 are deposited in order on the membrane 130 covering the cavity part 170, thereby forming stacked resonance part. When an external electric field is applied to the lower and the upper electrodes 140 and 160, piezoelectric effect occurs in the piezoelectric layer 150, and accordingly, the stacked resonance part, which includes the membrane 130, the lower and the upper electrodes 140 and 160, and the piezoelectric layer 150, generates resonance.

The membrane 130 is under the stacked resonance part to support the whole FBAR and insulate the lower electrode 140 and the substrate 110 from each other. In the isolation part 200, the membrane 130 is disposed between lower and upper capacitor electrodes 120 and 160, thereby serving as a dielectric layer in the capacitor. More specifically, a metal layer 120 is deposited on the substrate 110 at a predetermined distance from the cavity part 170 to form the lower capacitor electrode 120. The membrane 130 and another metal layer 160, which is the upper capacitor electrode, are deposited, thereby forming the capacitor having an electrostatic capacitance C proportional to a certain permittivity $\in$ of the membrane 130. The capacitance C can be expressed by an equation $C=\in*(A/L)$, wherein A denotes an area of the lower and upper capacitor electrodes 120 and 160, and L denotes a distance between the capacitor lower and upper electrodes 120 and 160.

The metal layer 160 is deposited on the membrane 130 in a coiled manner, thereby forming the inductor. The inductor is combined with the capacitor to form the isolation part 200. Thus, the isolation part 200 shares the membrane 130 with the second filter 300, and accordingly, the isolation part 200 and the second filter 300 are integrally formed.

FIGS. 4A–4F illustrate processes of fabricating the MEMS structure 100 having the above structure of FIG. 3. According to FIG. 4A, the first metal layer 120 is deposited on the substrate 110, and patterned to be left only on a predetermined area. The first metal layer 120, for the lower electrode of the capacitor, is made of one of conductive materials such as Al, W, Au, Pt and Mo. The patterning may be performed by dry etching which uses gas, plasma and ion beam.

Figure 4A:
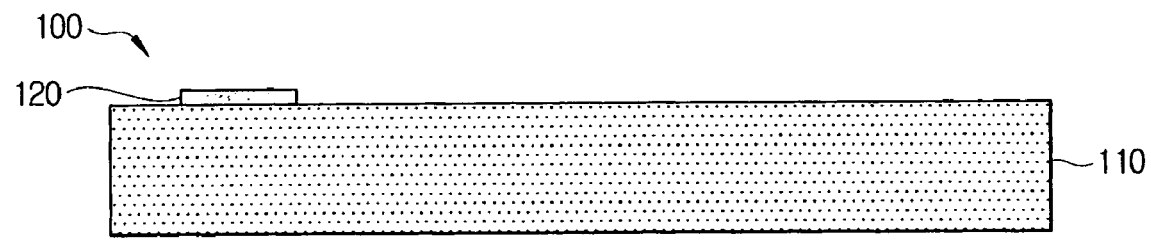
FIGS. 4A through 4F illustrate processes of fabricating the structure of FIG. 3.
Figure 4B:
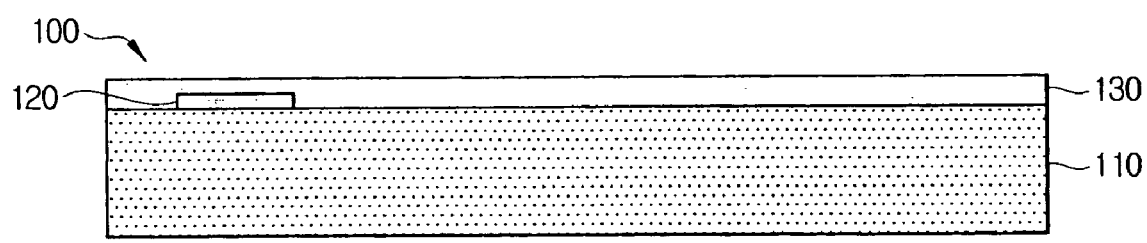

In FIG. 4B, the membrane 130 is deposited on the first metal 120 and over the whole substrate 110. The membrane 130 supports the resonance part and also serves as an insulation layer between the FBAR lower electrode 140 and the substrate 110. Insulator such as SiN or SiO2 can be used for the membrane 130.

Figure 4C:
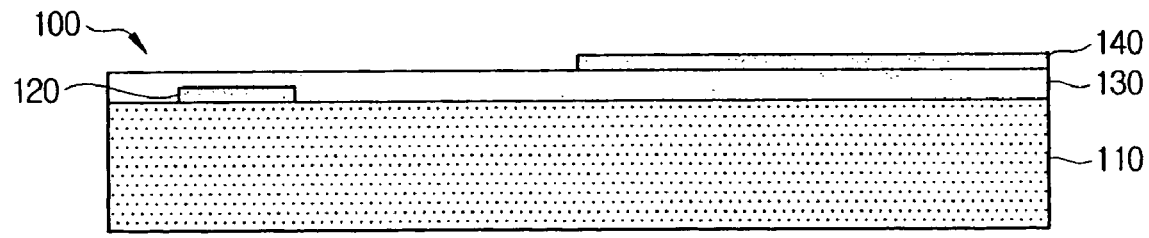

As shown in FIG. 4C, a second metal layer 140 is deposited on the membrane 130 and patterned to be left only on a predetermined area of the membrane 130. The second metal layer 140 becomes the lower electrode of the FBAR, and may be formed of the same material as the first metal layer 120.

Figure 4D:
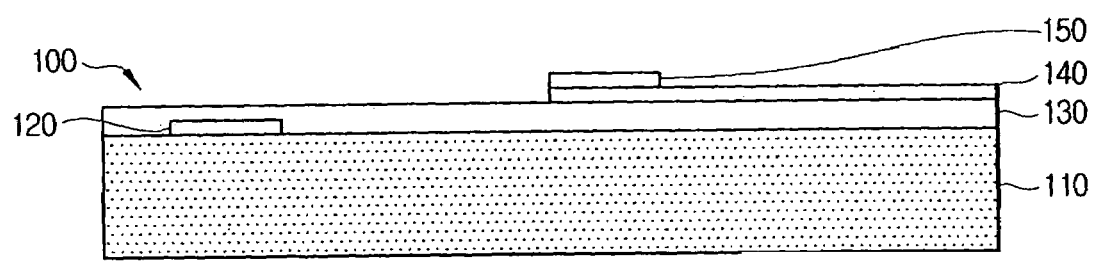

In FIG. 4D, the piezoelectric layer 150 is deposited on a predetermined area of the second metal layer 140. AlN or ZnO are generally used for piezoelectric material, however, it is not limited so. For the deposition, one of a sputtering method and an evaporation method may be adopted.

Figure 4E:
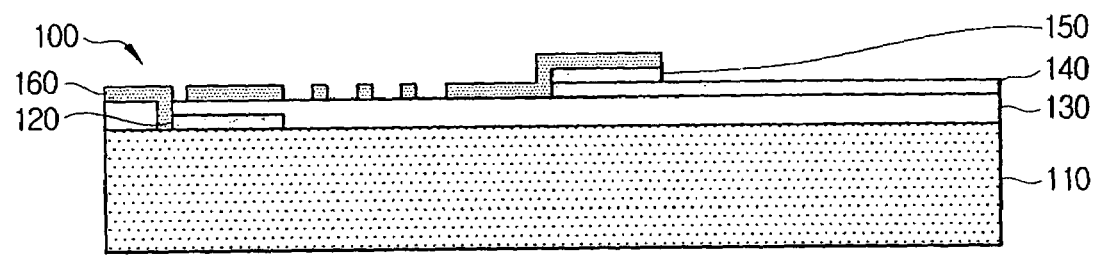

In FIG. 4E, a third metal layer 160 is deposited and patterned on the piezoelectric layer 150 to form the upper capacitor electrode, the inductor, and the upper FBAR electrode at the same time. More specifically, by depositing the third metal layer 160 on the membrane 130 deposited on the first metal layer 120, the capacitor using the membrane 130 as the dielectric layer can be fabricated. At the same time, the inductor is formed by patterning the third metal layer 160 in a coil type on a predetermined area of the membrane 130. In addition, the FBAR upper electrode is formed by patterning the third metal layer 160 to be deposited on the piezoelectric layer 150. Accordingly, the isolation part 200 and the FBAR 300 are integrally fabricated. The third metal layer 160 can be formed of the same material as the first and the second metal layer 120 and 140. Since the lower capacitor electrode 120 is disposed under the membrane 130, a portion for connection with the external electrode is necessitated. Therefore, an exposed pad portion is formed by depositing the third metal layer 160 to penetrate a certain portion of the membrane 130.

Figure 4F:
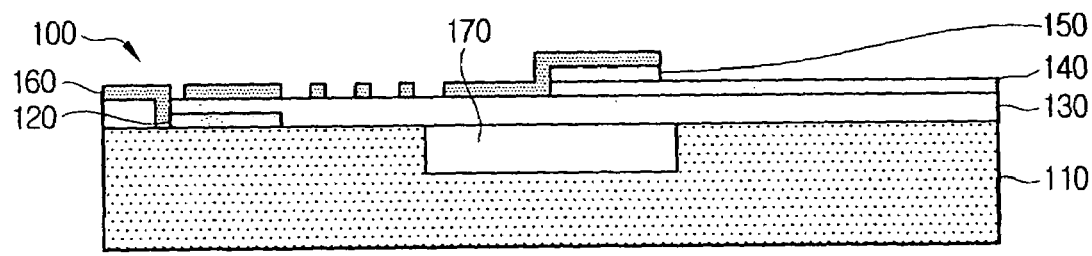

FIG. 4F illustrates that a predetermined area of the lower substrate 110 of the stacked resonance part is etched to complete the air gap-type FBAR 300. After a via hole is formed through the membrane 130 up to the lower substrate 110 of the laminated resonance part, the cavity part 170 is formed by dry-etching or wet-etching a predetermined area of the substrate 110. The wet-etching method uses chemical solvent such as acetic aqueous solvent, hydrofluoric acid, and phosphatic aqueous solvent while the dry-etching method uses gas, plasma and ion beam. By forming the cavity part 170 as above, the air gap-type FBAR 300 is completed. As described above, the MEMS structure having the integral isolation part 200 and the FBAR 300 can be fabricated.

The fabricated MEMS structure 100 is integrated on the separate substrate together with the separately-formed first filter 20, and is connected to the electrode terminal 10 by wire bonding. As a result, the duplexer having the structure as in FIG. 2 is completed.

As described above, according to an embodiment of the present invention, the FBAR 300 and the isolation part 200 can be integrally formed. In addition, the whole manufacturing process becomes simplified since the FBAR 300 and the isolation part 200 share the same component parts and fabricating processes. Furthermore, the duplexer can be minimized by use of the integral FBAR 300 and the isolation part 200. In case that the capacitor and the duplexer are used for the isolation part 200, a dedicated dielectric layer for the capacitor is not required, but the membrane 130 of the filter can serve as the dielectric layer. Accordingly, damage on other component parts due to high temperature is prevented while forming the dielectric layer.

While the invention has been shown and described with reference to certain embodiments thereof, it will be understood by those skilled in the art that various changes in form and details may be made therein without departing from the spirit and scope of the invention as defined by the appended claims.

What is claimed is:

1. A duplexer comprising:

a substrate;

a transmitter filter integrated on the substrate to pass signals only in a frequency band for transmission;

a receiver filter integrated on the substrate to pass signals only in a frequency band for reception; and an isolation part integrally formed with the transmitter filter or integrally formed with the receiver filter to isolate the signals passed through the transmitter filter from the signals passed through the receiver filter, wherein at least one of the transmitter filter and the receiver filter comprises at least one film bulk acoustic resonator (FBAR), said FBAR comprising a cavity part formed on a predetermined area of the substrate, a membrane deposited on the substrate and covering the cavity part, and a stacked resonance part formed on a cavity-covering part of the membrane, the stacked resonance part comprising a lower electrode, a piezoelectric layer and an upper electrode stacked in order, wherein the isolation part comprises at least one capacitor using the membrane as a dielectric layer and having an electrostatic capacitance proportional to a permittivity of the membrane, and at least one inductor formed in a coil type on a surface of the membrane, to isolate the signals passing through the transmitter filter and the signals passing through the receiver filter by making a frequency phase difference of the signals passing through the transmitter filter and the signals passing through the receiver filter to be substantially 90°.

2. The duplexer according to claim 1, wherein the capacitor comprises:

a capacitor lower electrode deposited between the substrate and the membrane; and a capacitor upper electrode deposited on the membrane disposed on the capacitor lower electrode.

3. A method for fabricating a duplexer which comprises a transmitter filter for passing signals only in a frequency band for transmission, a receiver filter for passing signals only in a frequency band for reception, and an isolation part for isolating the signals passed through the transmitter filter and from the signals passed through the receiver filter, the method comprising:

(a) depositing and patterning a first metal layer on a substrate;

(b) depositing a membrane on the first metal layer and over the whole substrate;

(c) depositing and patterning a second metal layer on a portion of the membrane which is directly contacting on the substrate;

(d) depositing a piezoelectric layer on a predetermined area of the second metal layer;

(e) depositing a third metal layer on the membrane and the piezoelectric layer; and (f) integrally forming the isolation part with one of the transmitter filter and the receiver filter, by patterning the third metal layer.

4. The method according to claim 3, further comprising:

forming a via hole reaching the substrate disposed under the piezoelectric layer; and forming a cavity part by etching a predetermined area of a lower substrate of the piezoelectric layer using the via hole.

5. The method according to claim 4, wherein at least one of the transmitter filter and the receiver filter comprises at least one film bulk acoustic resonator (FBAR) formed by depositing the second metal layer, the piezoelectric layer, and the third metal layer in order on a portion of the membrane which covers the cavity part.

6. The method according to claim 5, wherein operation (f) comprises:

forming a capacitor by patterning the third metal layer so that the third metal layer is formed on a portion of the membrane deposited on the first metal layer;

forming an inductor by patterning the third metal layer so that the third metal layer is formed in a coil type; and forming the FBAR by patterning the third metal layer so that the third metal layer is formed on the piezoelectric layer.

* * * * *